United States Patent [19]
Yoo et al.

[11] Patent Number: 5,661,338
[45] Date of Patent: Aug. 26, 1997

[54] CHIP MOUNTING PLATE CONSTRUCTION OF LEAD FRAME FOR SEMICONDUCTOR PACKAGE

[75] Inventors: Youn Cheol Yoo; Hee Yeoul Yoo, both of Seoul; Jeong Lee, Joongyang-Ku; Doo Hyun Park, Young Dung Po-Ku; In Gyu Han, Seoul, all of Rep. of Korea

[73] Assignees: Anam Industrial Co., Ltd., Seoul, Rep. of Korea; Amkor Electronics, Inc., Chandler, Ariz.

[21] Appl. No.: 571,316

[22] Filed: Dec. 12, 1995

[30] Foreign Application Priority Data

Dec. 14, 1994 [KR] Rep. of Korea ............ 94-33994
Dec. 27, 1994 [KR] Rep. of Korea ............ 94-37168

[51] Int. Cl.⁶ ............... H01L 23/48; H01L 23/12; H01L 23/50; H01L 23/28
[52] U.S. Cl. ............... 257/676; 257/672; 257/674; 257/670; 257/711; 257/649
[58] Field of Search ............... 257/666, 672, 257/674, 676, 670, 668, 773, 711, 730, 669, 667

[56] References Cited

U.S. PATENT DOCUMENTS

| | | | |
|---|---|---|---|
| 4,390,598 | 6/1983 | Ply | 257/666 |
| 5,021,865 | 6/1991 | Takahashi et al. | 257/676 |
| 5,233,222 | 8/1993 | Djennas et al. | 257/666 |
| 5,294,827 | 3/1994 | McShane | 257/676 |
| 5,327,008 | 7/1994 | Djennas et al. | 257/666 |
| 5,360,992 | 11/1994 | Lowrey et al. | 257/666 |
| 5,521,428 | 5/1996 | Hollingsworth et al. | 257/674 |

FOREIGN PATENT DOCUMENTS

| | | | |
|---|---|---|---|
| 0184854 | 8/1986 | Japan | 257/676 |
| 0061397 | 3/1994 | Japan | 257/676 |
| 021630 | 8/1994 | Japan | 257/666 |

*Primary Examiner*—Sara W. Crane
*Assistant Examiner*—Alexander Oscar Williams
*Attorney, Agent, or Firm*—Skjerven, Morrill, MacPherson, Franklin, & Friel; Thomas S. MacDonald

[57] ABSTRACT

A chip mounting plate construction of lead frames for semiconductor packages which provides a chip mounting plate having a greatly reduced area to obtain a small bonding area between the chip mounting plate and a semiconductor chip mounted on the chip mounting plate, thereby capable of minimizing thermal strain generated at the chip mounting plate due to a thermal expansion thereof. The chip mounting plate is constructed to have a smaller area than the semiconductor chip, to have a central opening, or to have recesses.

7 Claims, 4 Drawing Sheets

CHIP MOUNTING PLATE CONSTRUCTION OF LEAD FRAME FOR SEMICONDUCTOR PACKAGE

BACKGROUND OF THE INVENTION

1. Field of the Invention

The present invention relates to a chip mounting plate construction of lead frames for semiconductor packages, and more particularly to an improvement in such a construction for providing a chip mounting plate having a unique shape with a reduced volume or area as compared to the well-known quadrilateral construction, thereby capable of reducing the bonding area of the chip mounting plate, to which a semiconductor chip is bonded, to minimize a strain generated at the chip mounting plate due to a thermal expansion thereof.

2. Description of the Prior Art

Generally, lead frames for semiconductor packages are made of metal. Such metal lead frames have a chip mounting plate on which a semiconductor chip made of a material different from the lead frame is mounted, and a plurality of leads arranged along the edge of the chip mounting plate. The leads are connected with chip pads of the semiconductor chip mounted on the chip mounting plate by means of a wire bonding so that transmission of electrical signal can be achieved between the semiconductor chip and each lead. After completing the wire bonding work, the lead frame with the semiconductor chip mounted on the chip mounting plate is molded into a single semiconductor package using a synthetic resin compound.

A chip mounting plate construction of conventional semiconductor package lead frames is shown in FIG. 1. Referring to FIG. 1, a chip mounting plate 3 is shown as having a sufficiently larger area than that of a semiconductor chip C mounted thereon so that it can sufficiently accommodate the entire area of the semiconductor chip C. Tee bars 3a are also shown. As a result, a large bonded area is formed between the chip mounting plate 3 and the semiconductor chip C bonded to the chip mounting plate 3 by means of an epoxy material 36. The chip mounting plate of lead frame may be subject to a high temperature working condition during the fabrication of a semiconductor package. Since the chip mounting plate 3 is made of a material different from that of the semiconductor chip C, it is thermally strained in a higher degree than that of the semiconductor chip C when the lead frame is subjected to a high temperature working condition due to a difference in thermal expansion coefficient between the chip mounting plate and the semiconductor chip. Since the bonded area between the chip mounting plate 3 and the semiconductor chip C is large, the thermal strain of the chip mounting plate 3 becomes higher. As a result, an interface lamination occurs at the bonded area of the semiconductor chip C mounted on the chip mounting plate 3. In particular, the severe strain of the chip mounting plate 3 results in a degraded operation of the semiconductor package finally fabricated and a degradation in product quality.

SUMMARY OF THE INVENTION

Therefore, an object of the present invention is to solve the above-mentioned problems involved in the prior art and to provide a chip mounting plate construction of lead frames for semiconductor packages which provides a chip mounting plate having a greatly reduced area to obtain a small bonding area between the chip mounting plate and a semiconductor chip mounted on the chip mounting plate, thereby capable of not only preventing the chip mounting plate from being severely strained due to a difference in thermal expansion coefficient between the chip mounting plate and the semiconductor chip when the lead frame made of metal is thermally expanded under a high temperature condition, but also preventing an interface lamination phenomenon from occurring at the bonded area between the chip mounting plate and the semiconductor chip, thereby achieving improvements in operation and quality of products.

Another object of the invention is to provide a chip mounting plate construction of lead frames for semiconductor packages which provides a chip mounting plate having connecting members connected to tie bars of the lead frame and adapted to absorb thermal strain generated at the chip mounting plate, thereby capable of reducing the thermal strain of the chip mounting plate caused by its thermal expansion due to a high temperature involved in the wire bonding and package molding process steps, so that a semiconductor chip bonded to the chip mounting plate by means of an epoxy material can be stably and firmly maintained.

In accordance with one aspect, the present invention provides a lead frame for a semiconductor package comprising a chip mounting plate to which a semiconductor chip is bonded, leads arranged along edges of the chip mounting plate and tie bars adapted to support the chip mounting plate, wherein the chip mounting plate has an area smaller than the entire bonding area of the semiconductor chip and has connecting members adapted to respectively connect the chip mounting plate to the tie bars. Each of the connecting members has a bent portion and a plurality of holes so as to absorb a thermal strain generated at the chip mounting plate.

In accordance with another aspect, the present invention provides a lead frame for a semiconductor package comprising a chip mounting plate to which a semiconductor chip is bonded, leads arranged along edges of the chip mounting plate and tie bars respectively connected to corners of the chip mounting plate, wherein the chip mounting plate comprises: a plurality of support members for connecting the chip mounting plate respectively to the tie bars in a fashion that the chip mounting plate is integral with the lead frame; and a plurality of thin damping members for connecting the support members to one another. The support members may be connected at one-side ends thereof to one another such that they have an X shape together. Each of the support members may have toothed side edges. The support members may also be connected at the other-side ends thereof to one another by the damping members.

In accordance with another aspect, the present invention provides a lead frame for a semiconductor package comprising a chip mounting plate to which a semiconductor chip is bonded, leads arranged along edges of the chip mounting plate and tie bars adapted to support the chip mounting plate, wherein the chip mounting plate has an opening at a central portion thereof, and a bonding portion at an upper surface portion thereof disposed around the opening. The bonding portion may be cut out at desired positions thereof such that the chip mounting plate is divided into two portions, thereby enabling it to have a minimum bonding area to which the semiconductor chip is bonded.

In accordance with another aspect, the present invention provides a lead frame for a semiconductor package comprising a chip mounting plate to which a semiconductor chip is bonded, leads arranged along edges of the chip mounting plate and tie bars adapted to support the chip mounting plate, wherein the chip mounting plate has a pair of recesses at both lateral portions thereof, respectively.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
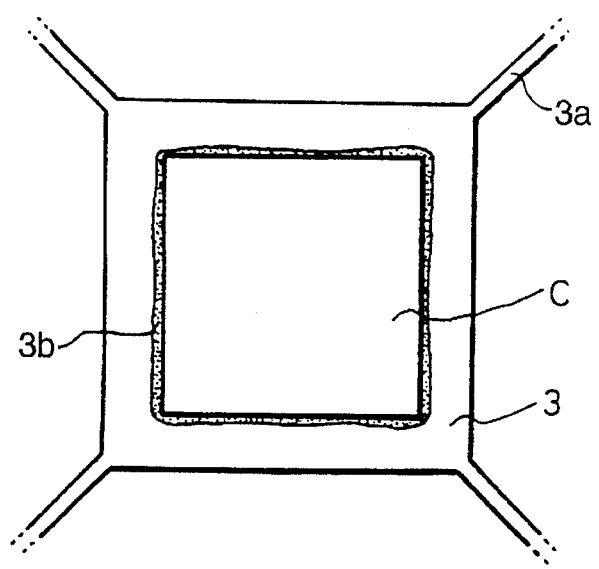
FIG. 1 is a plan view illustrating a chip mounting plate construction of conventional semiconductor package lead frames.
Figure 2:
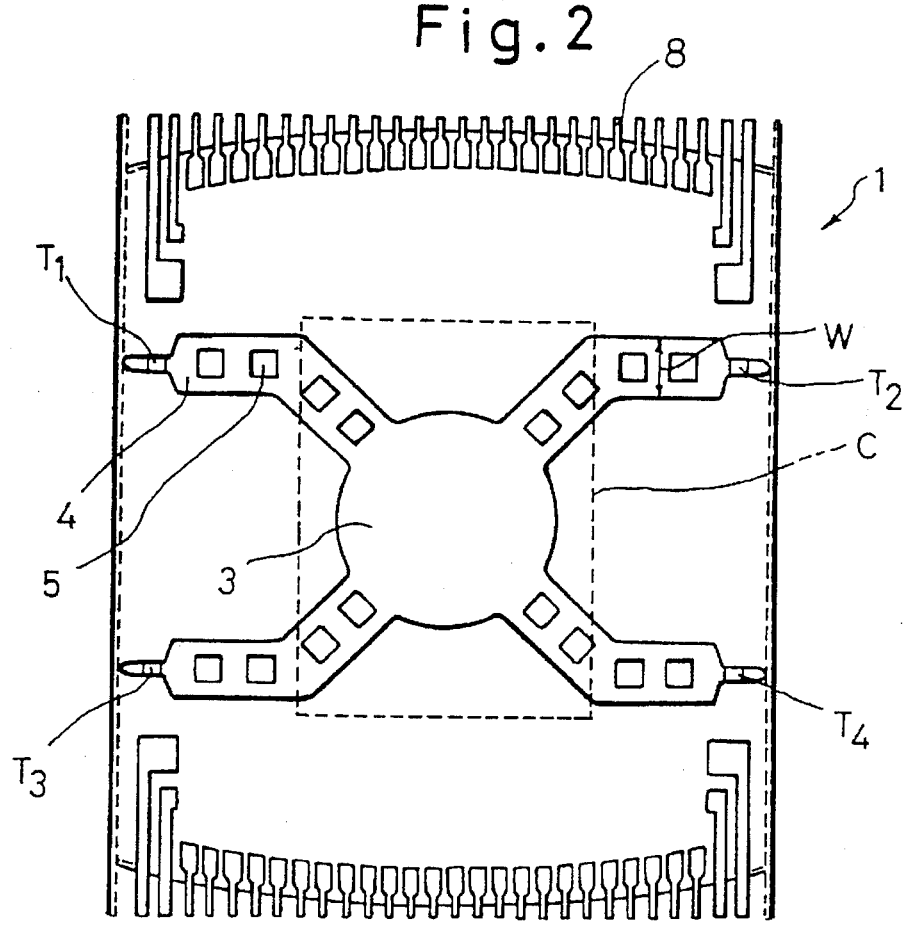
FIG. 2 is a plan view illustrating a chip mounting plate of a lead frame constructed in accordance with a first embodiment of the present invention.

FIG. 2 shows a chip mounting plate of a lead frame constructed in accordance with a first embodiment of the present invention.

As shown in FIG. 2, the chip mounting plate, which is denoted by the reference numeral 3, has a construction having a smaller area than that of a semiconductor chip C which is to be mounted on the chip mounting plate, thereby providing a minimum bonding area to which the semiconductor chip C is bonded by means of an epoxy material. In FIG. 2, the entire area of the semiconductor chip C is depicted by the phantom line. The chip mounting plate 3 includes a plurality of connecting members 4 outwardly extending from the chip mounting plate. The connecting members 4 are connected to tie bars $T_1$ to $T_4$ of the lead frame so that the chip mounting plate 3 can be supported to the lead frame.

In accordance with the chip mounting plate construction shown in FIG. 2, the semiconductor chip C is mounted not only on the chip mounting plate, but also on portions of the connecting members 4.

Since the chip mounting plate 3 has a bonding area to which only a part of the semiconductor chip C is bonded, it is possible to minimize thermal strain generated at the chip mounting plate 3 due to heat applied thereto under a high temperature condition required at a wire bonding or package molding process step carried out in fabrication of semiconductor packages.

Even when the semiconductor chip C exhibiting a small thermal strain is mounted on the chip mounting plate 3 of the lead frame 1 made of a metal material exhibiting a high thermal strain, it is possible to prevent occurrence of an interface lamination phenomenon between the semiconductor chip C and the chip mounting plate 3 because the chip mounting plate 3 involves a reduced thermal strain by virtue of its relatively small bonding area as compared to the semiconductor chip C.

Although the chip mounting plate 3 has a circular shape in the illustrated case, it may have other shapes such as oval, quadrilateral or polygonal shape in so far as it can provide a minimum bonding area to which the semiconductor chip C is bonded.

It is preferred that the connecting members 4 respectively provided between the tie bars $T_1$ to $T_4$ of lead frame and the chip mounting plate 3 have a width W reduced as much as possible. Preferably, each connecting member 4 is also provided with a plurality of spaced holes 5. By virtue of the small width of connecting members 4 and the holes 5, it is possible not only to minimize a possible deformation of the connecting members 4 caused by high temperature heat applied thereto, but also to prevent thermal strain from being generated at the chip mounting plate B. It is also possible to easily fill a mold compound in non-bonded gaps between the semiconductor chip C and the chip mounting plate 3 at a package molding step. Accordingly, formation of mold voids in slight gaps can be avoided. Thus, the chip mounting plate 3 and semiconductor chip C can be molded into a package in an optimum state.

It is also preferred that each of the connecting members 4 has a bent portion at a desired area thereof so that it can absorb thermal strain generated therein. Although the holes 5 provided at each connecting member 4 has a quadrilateral shape in the illustrated case, they may have other shapes such as a circular or polygonal shape.

FIGS. 3 to 6 illustrate various chip mounting plate constructions in accordance with second to fifth embodiments of the present invention, respectively.

In accordance with these embodiments of the present invention, the chip mounting plate 3 for supporting the semiconductor chip C is constituted by a plurality of support members respectively connected to the tie bars $T_1$ to $T_4$. The support members are also connected to one another by means of thin damping members. With such a construction, the chip mounting plate 3 can have a function to absorb and damp thermal stress. Now, these embodiments of the present invention will be individually described in detail.

Figure 3:
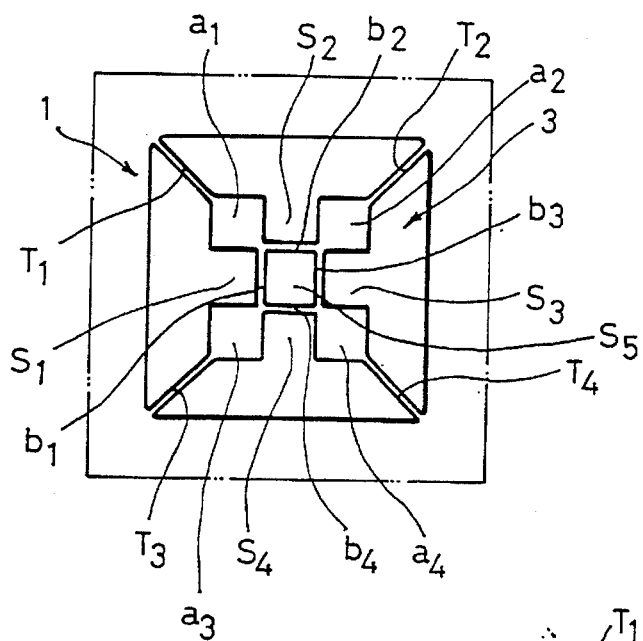
FIGS. 3 to 6 are plan views respectively illustrating various chip mounting plate constructions in accordance with second to fifth embodiments of the present invention.

In accordance with the second embodiment shown in FIG. 3, the chip mounting plate 3 comprises four support members $a_1$ to $a_4$ respectively connected to tie bars $T_1$ to $T_4$ in a fashion that they are integral with the tie bars. The support members $a_1$ to $a_4$ are also connected to one another by four thin damping members $b_1$ and $b_4$, respectively. Between adjacent ones of the support members $a_1$ to $a_4$, relatively large spaces $S_1$ to $S_4$ are defined, respectively. At the central portion of the chip mounting plate 3, a space $S_5$ is also defined by the damping members $b_1$ to $b_4$ adapted to connect the support members $a_1$ to $a_4$.

Figure 4:
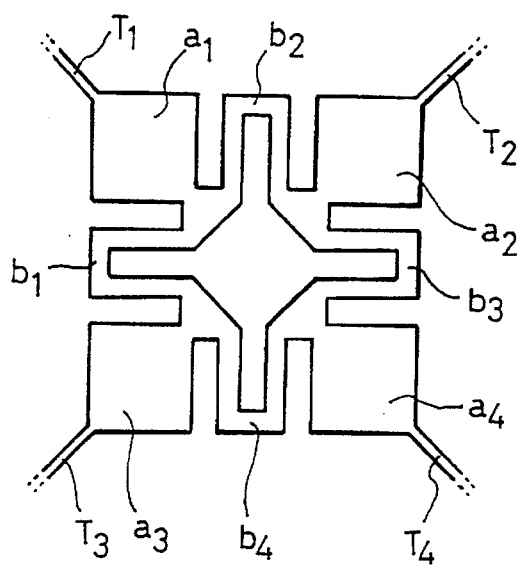

The chip mounting plate according to the third embodiment shown in FIG. 4 has the same basic construction as the second embodiment shown in FIG. 3 in that it comprises four support members $a_1$ to $a_4$ respectively connected to tie bars $T_1$ to $T_4$ and connected to one another by thin damping members $b_1$ to $b_4$. In the construction of FIG. 4, however, the construction of thin damping members $b_1$ to $b_4$ is different from that of FIG. 3. In accordance with the second embodiment of the present invention, the damping members $b_1$ to $b_4$ have a U-shaped construction so that they can entirely absorb thermal stress transmitted to the support members $a_1$ to $a_4$. In accordance with this embodiment, accordingly, it is possible to more effectively prevent the chip mounting plate from being thermally strained.

Figure 5:
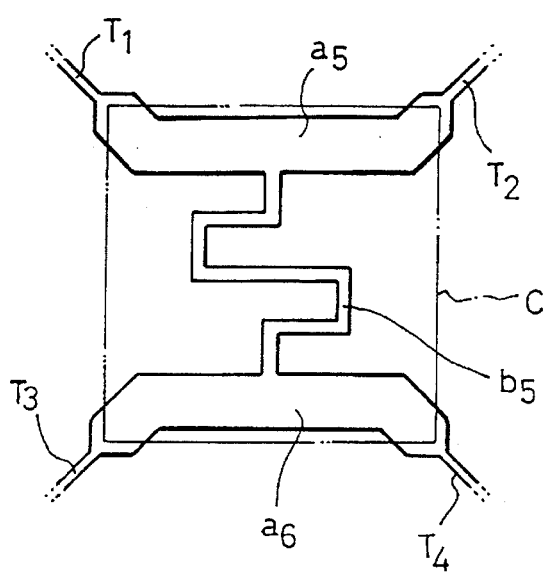

In accordance with the fourth embodiment shown in FIG. 5, the chip mounting plate comprises a pair of support members $a_5$ and $a_6$ each connected at both ends thereof to a pair of tie bars $T_1$ and $T_2$, or T sand $T_4$. The support members $a_5$ and $a_6$ are connected to each other by a thin damping member $b_5$ having a zig-zag shape. In this case, it is also possible to effectively absorb and damp thermal stress applied to the chip mounting plate 3.

Figure 6:
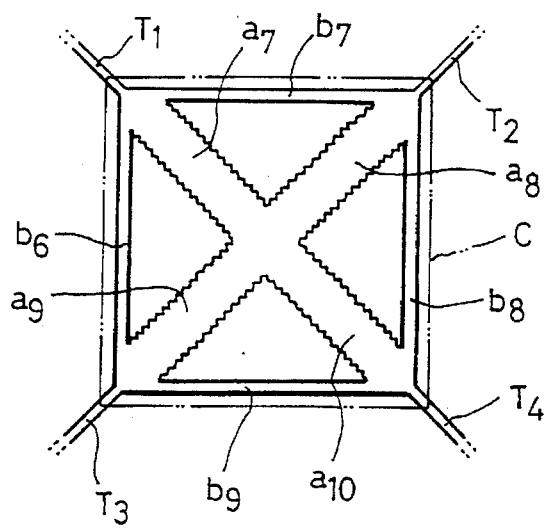

On the other hand, the chip mounting plate according to the fifth embodiment shown in FIG. 6 comprises four support members $a_7$ to $a_{10}$ each connected at one end thereof to each corresponding tie bars $T_1$ to $T_4$. The support members $a_7$ to $a_{10}$ are connected to one another at respective other ends thereof such that they have a well-known X-shaped construction. In accordance with this embodiment, each of the X-shaped support members $a_7$ to $a_{10}$ have toothed side edges. Adjacent ones of the support members $a_7$ to $a_{10}$ are connected at one-side ends thereof together by thin damping members $b_6$ to $b_9$, respectively. With this construction, it is possible to minimize the contact area between the chip mounting plate and the semiconductor chip while increasing the coupling force of the chip mounting plate to a mold compound upon molding the lead frame into a semiconductor package. Accordingly, there is no lamination or cracking phenomenon occurring at an interface between the chip mounting plate and the mold compound due to a thermal strain of the chip mounting plate.

Figure 7:
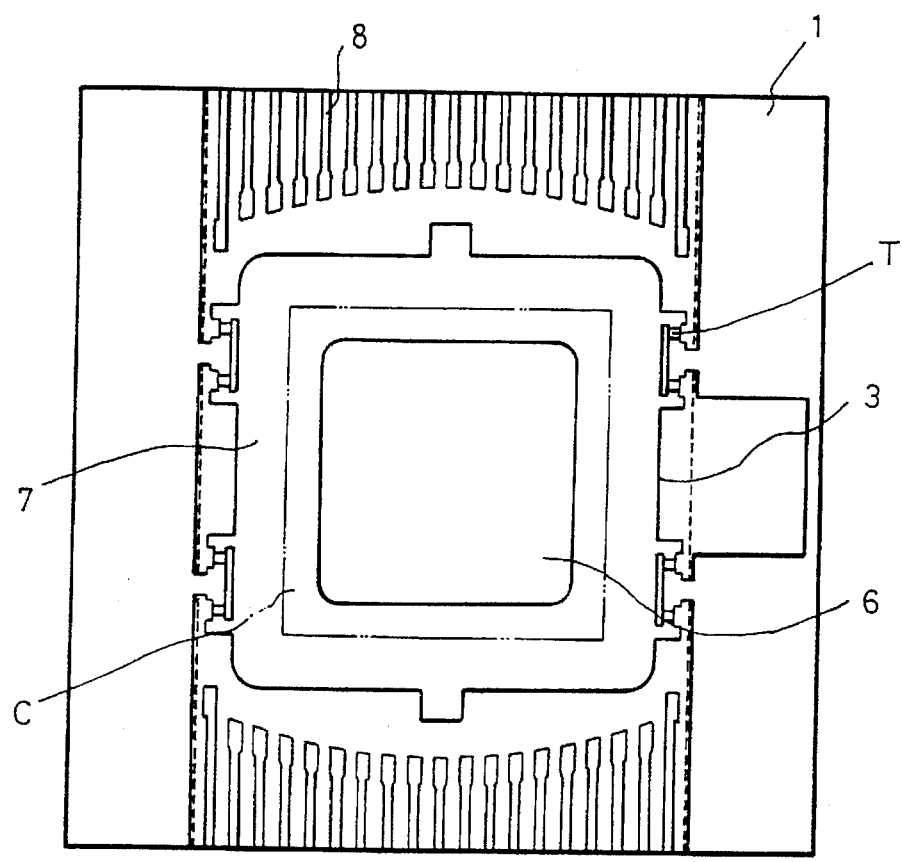
FIGS. 7 and 8 are plan views respectively illustrating other chip mounting plate constructions in accordance with sixth and seventh embodiments of the present invention.
Figure 8:
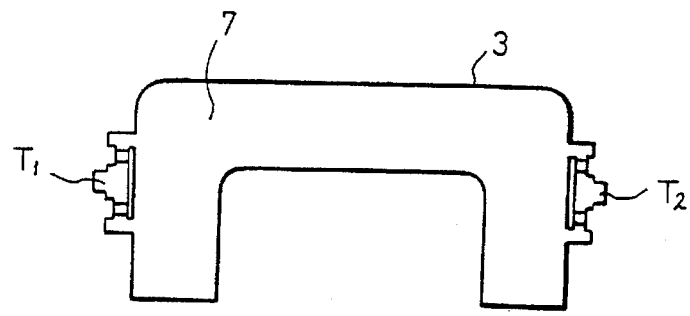

FIGS. 7 and 8 illustrate other chip mounting plate constructions in accordance with sixth and seventh embodiments of the present invention, respectively.

In accordance with the sixth embodiment shown in FIG. 7, the chip mounting plate, which is denoted by the reference numeral 3, has a square or rectangular shape and is disposed centrally of a lead frame. The chip mounting plate 3 is connected at both side portions of opposite lateral edges thereof to tie bars T of the lead frame so that it is integral with the lead frame. The chip mounting plate 3 has a central opening 6 having a square or rectangular shape. An upper surface portion of the chip mounting plate 3 disposed around the opening 6 is used as a bonding portion of the chip mounting plate 3. A semiconductor chip C is bonded to the chip mounting plate 3 under the condition that an epoxy material is coated over the bonding portion. After the semiconductor chip C is mounted on the chip mounting plate, chip pads provided at the semiconductor chip C are connected to leads 8 provided at the lead frame by means of wires, respectively.

The process of connecting the semiconductor chip C to leads 8 by wires is called "a wire bonding process". During such a wire bonding, the semiconductor chip C and chip mounting plate 3 are subjected to different thermal strains resulted from different thermal expansion coefficients thereof, due to a high temperature of 200° to 240° C. applied thereto. The thermal strain generated at the bonding portion of chip mounting plate 3, to which the semiconductor chip C is bonded, is reduced by the central opening 6 provided at the chip mounting plate 3. In other words, the construction shown in FIG. 7 can greatly prevent the strain of the chip mounting plate 3 resulted from the thermal expansion thereof because the bonding portion 7 has a small area as the entire area of the chip mounting plate is reduced by the area of the opening 6.

After completing the wire bonding work for connecting chip pads of the semiconductor chip C on the chip mounting plate 3 to leads 8 of the lead frame by means of wires, a molding process is carried out not only to protect the semiconductor device from damages caused by external force, erosion and heat, but also to ensure a stability in electrical and mechanical characteristics of the semiconductor device. By the molding work, the lead frame, on which the semiconductor chip is mounted, is molded into a package using a synthetic resin molding compound after being heated to a high temperature of, for example, 175° C. During the molding, both the semiconductor chip C and the chip mounting plate 3 are thermally expanded again by the high temperature heat applied thereto. In the construction of FIG. 7, however, there is no strain at the bonding area between the chip mounting plate 3 and the semiconductor chip C because the bonding portion 7 of chip mounting plate 3 has a reduced area by virtue of the central opening 6 of chip mounting plate 3. Accordingly, the chip mounting plate 3 and semiconductor chip C can be maintained in a firmly bonded state.

In accordance with the seventh embodiment shown in FIG. 8, the chip mounting plate, which is denoted by the reference numeral 3, has a similar construction as that of the sixth embodiment shown in FIG. 7, except that it is divided into two separate portions. In this case, the bonding area between the semiconductor chip C and the chip mounting plate 3 is further reduced so as to maximally reduce the strain of the chip mounting plate generated due to a high temperature heat applied thereto during the wire bonding and package molding works.

Figure 9:
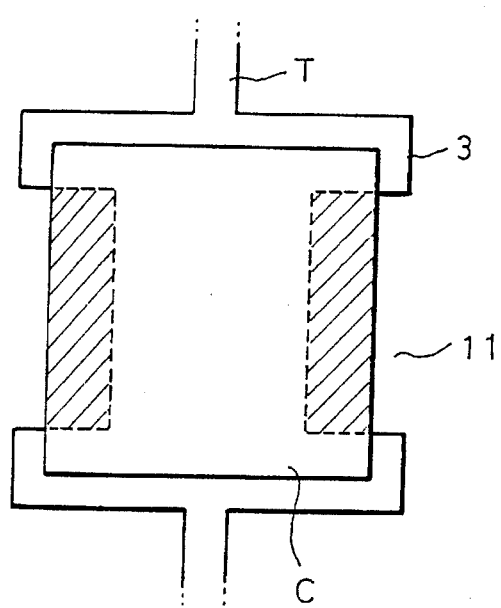
FIGS. 9 and 10 are plan views respectively illustrating other chip mounting plate constructions in accordance with eighth and ninth embodiments of the present invention.
Figure 10:
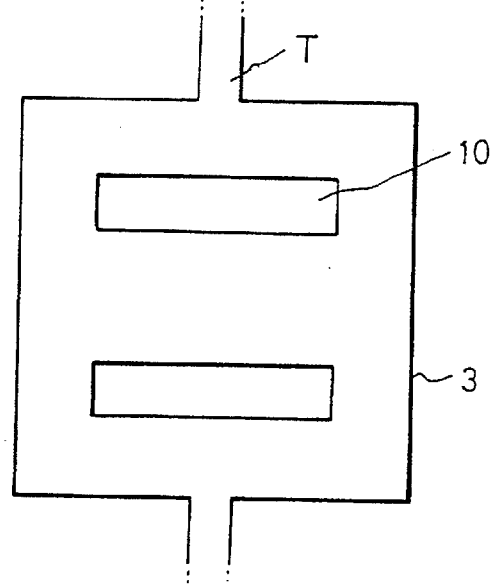

FIGS. 9 and 10 illustrate other chip mounting plate constructions in accordance with eighth and ninth embodiments of the present invention, respectively.

FIG. 9 shows a chip mounting plate of semiconductor package lead frame, on which a semiconductor chip is mounted, in accordance with the eighth embodiment of the present invention. As shown in FIG. 9, the chip mounting plate, which is denoted by the reference numeral 3, has a construction including a pair of recesses 11 formed at opposite lateral portions of the chip mounting plate 3. The chip mounting plate 3 is connected at upper and lower portions thereof to tie bars T respectively upper and lower portions of the lead frame 1. The recesses 11 can be provided by cutting out the opposite lateral portions of the chip mounting plate 3. By virtue of these recesses 11, the entire area of the chip mounting plate 3 is reduced, thereby minimizing the bonding area between the semiconductor chip C and the chip mounting plate 3.

Although the recesses 11 have a rectangular shape in the illustrated case, they may have other shapes such as circular or triangular shape.

In accordance with the ninth embodiment of the present invention, the chip mounting plate 3 has one or more openings 10 (two openings in the illustrated case) adapted to reduce the bonding area between the chip mounting plate 3 and the semiconductor chip C. Although the openings 10 have a rectangular shape in the illustrated case, they may have other shapes such as a circular or triangular shape.

As apparent from the above description, the present invention provides a chip mounting plate construction of semiconductor package lead frames capable of achieving a reduction in the area of the chip mounting plate to which a semiconductor chip is bonded and yet maintaining a firm bonding condition between the semiconductor chip and the chip mounting plate to reduce a thermal strain of the chip mounting plate caused by a thermal expansion thereof. Accordingly, the present invention provides effects of preventing an interface lamination from occurring between the chip mounting plate and the semiconductor chip and achieving an improvement in the reliability of semiconductor packages.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A lead frame for a semiconductor package comprising a chip mounting plate to which a semiconductor chip is bonded, leads arranged along edges of the chip mounting plate and tie bars respectively connected to corners of the chip mounting plate, wherein the chip mounting plate comprises:

a plurality of support members for connecting the chip mounting plate respectively to the tie bars so that the chip mounting plate is integral with the lead frame, each support member having a width;

a plurality of thin damping members for connecting the support members to one another, each thin damping member having a width narrower than the width of each support member;

a first side of each support member connected to one of the tie bars;

a second side of each support member connected to one of the thin damping members; and a central portion of the chip mounting plate, the central portion having an opening defined by the plurality of thin damping members.

2. The lead frame in accordance with claim 1, wherein each of the thin damping members has a U-shaped construction.

3. The lead frame in accordance with claim 1, wherein each of the thin damping members has a zig-zag shape.

4. The lead frame in accordance with claim 1, wherein each of the support members is rectangular in shape and has a first corner on the first side and a second corner diametrically opposed to the first corner on the second side, and wherein the first corner is connected to one of the tie bars and the second corner is connected to one of the thin damping members.

5. The lead frame in accordance with claim 4, wherein each of the thin damping members extends in a zig-zag shape from the second corner of one support member to the second corner of another support member.

6. A lead frame for a semiconductor package comprising a chip mounting plate to which a semiconductor chip is bonded, leads arranged along edges of the chip mounting plate and tie bars respectively connected to corners of the chip mounting plate, wherein the chip mounting plate comprises:

a pair of support members, each support member connected at both ends thereof to a pair of tie bars; and a thin damping member having a zig-zag shape and connecting one support member to the other support member.

7. The lead frame in accordance with claim 6, wherein the pair of support members comprises a pair of parallel strips, each parallel strip having a central portion, and the thin damping member extends from adjacent the central portions of the support members.

* * * * *